United States Patent [19]
Kuo

[11] Patent Number: 5,940,448
[45] Date of Patent: Aug. 17, 1999

[54] UNIVERSAL SERIAL BUS RECEIVER HAVING INPUT SIGNAL SKEW COMPENSATION

[75] Inventor: James R. Kuo, Cupertino, Calif.

[73] Assignee: National Semiconductor Corporation, Santa Clara, Calif.

[21] Appl. No.: 08/922,933

[22] Filed: Sep. 3, 1997

[51] Int. Cl.[6] .................................................. H03K 9/00
[52] U.S. Cl. ........................ 375/316; 375/371; 395/552
[58] Field of Search .................................... 375/219, 229, 375/232, 316, 318, 371; 395/500, 551, 552

[56] References Cited

U.S. PATENT DOCUMENTS

| | | | |
|---|---|---|---|
| 5,262,690 | 11/1993 | Cochran et al. | 307/601 |
| 5,266,847 | 11/1993 | Kuo | 307/475 |
| 5,452,333 | 9/1995 | Guo et al. | 375/371 |
| 5,467,464 | 11/1995 | Oprescu et al. | 395/550 |
| 5,489,861 | 2/1996 | Seymour | 327/108 |
| 5,524,236 | 6/1996 | Ostrowski | 395/500 |
| 5,587,709 | 12/1996 | Jeong | 375/371 |
| 5,608,757 | 3/1997 | Smith et al. | 375/229 |
| 5,805,639 | 9/1998 | Tonch et al. | 375/232 |

*Primary Examiner*—Stephen Chin
*Assistant Examiner*—Chieh M. Fan
*Attorney, Agent, or Firm*—Limbach & Limbach L.L.P.

[57] ABSTRACT

A receiver includes first and second input nodes and a differential receiver having first and second inputs respectively connected to the first and second input nodes, as well as first and second outputs. First and second delay circuits are respectively connected to the first and second outputs of the differential receiver. First and second single-ended receivers each having an input are respectively connected to the first and second input nodes, the first and second single-ended receivers each having an output. Input glitch prevention circuitry includes third and fourth delay circuits that are respectively connected to the outputs of the first and second single-ended receivers and an OR gate having separate inputs that are respectively connected to the outputs of the first and second single-ended receivers and the outputs of the third and fourth delay circuits. Symmetrical delay compensation circuitry includes a fifth delay circuit that is connected to an output of the OR gate and a first AND gate having separate inputs that are respectively connected to the output of the OR gate and an output of the fifth delay circuit. Second and third AND gates each having an input are connected to an output of the first AND gate and an input is respectively connected to the outputs of the first and second delay circuits. A method of receiving differential input signals is also disclosed.

19 Claims, 6 Drawing Sheets

UNIVERSAL SERIAL BUS RECEIVER HAVING INPUT SIGNAL SKEW COMPENSATION

BACKGROUND OF THE INVENTION

1. Field of the Invention

The present invention relates to bus line receivers, and more particularly, to a receiver which meets the specifications for the Universal Serial Bus and that compensates for skew in the differential inputs.

2. Description of the Related Art

Figure 1:
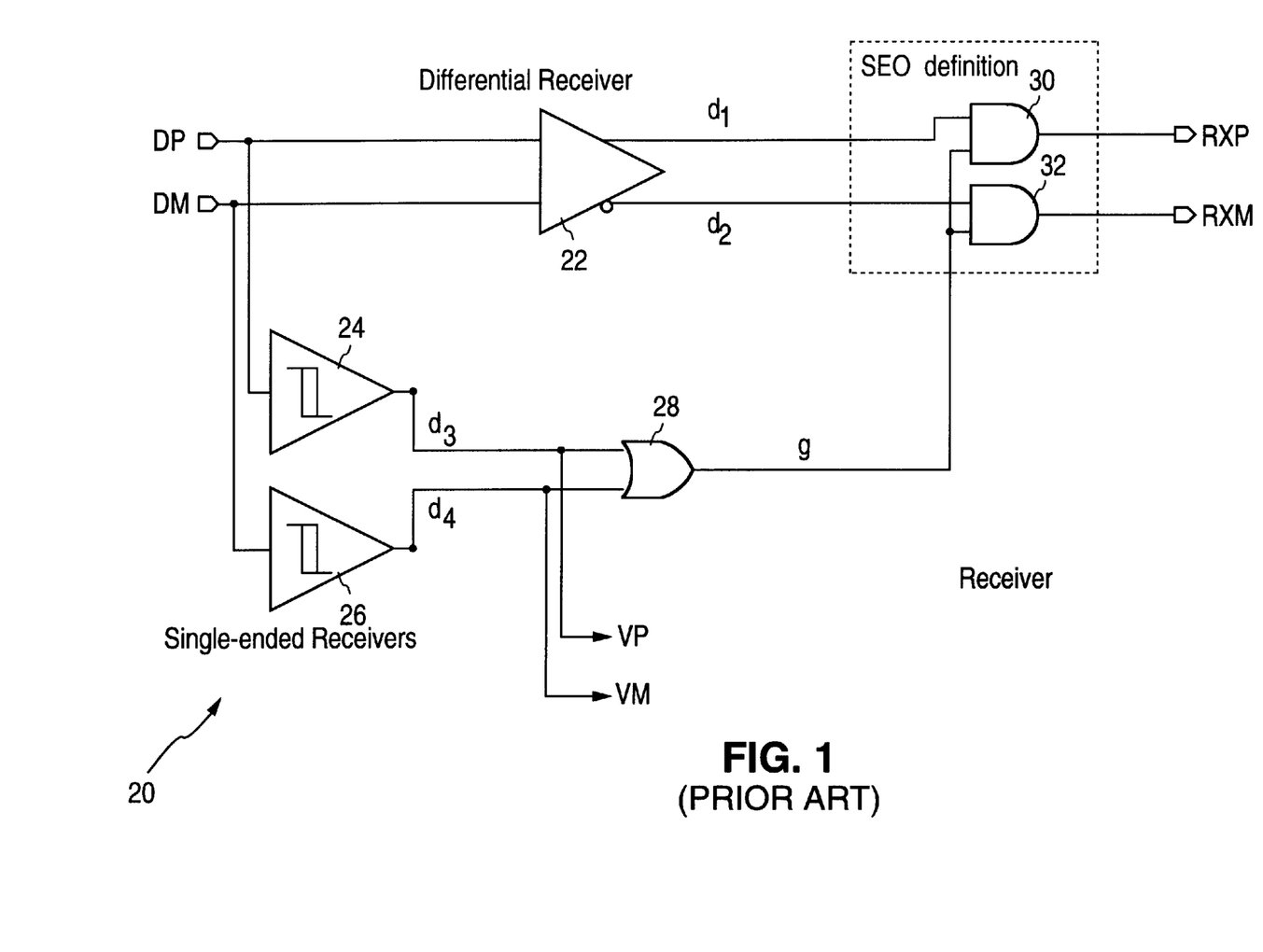
FIG. 1 is a schematic diagram illustrating a prior art USB receiver.

Referring to FIG. 1, there is illustrated a prior art Universal Serial Bus (USB) receiver 20. The USB standard specifies that the USB receiver 20 must have an input sensitivity of at least 200 mV when both differential data inputs DP, DM are in the range of at least 0.8 V to 2.5 V with respect to its local ground reference. The USB standard also specifies that a differential input receiver 22 must be used to accept the USB data input signals DP, DM, and that both inputs DP and DM must be zero to signal an end of packet (EOP) condition. The differential receiver 22 is used to detect the differential signal between the two inputs DP, DM, and two single-ended receivers 24, 26 for the two data input lines DP, DM, respectively, are used to detect the EOP condition.

The purpose of the single-ended receivers 24, 26 is to make outputs RXP, RXM both go to zero to signal the EOP condition. When both inputs DP, DM are driven with single-ended zero for two bits to indicate the EOP condition, outputs $d_1$, $d_2$ of the differential receiver 22 become undefined. The two single-ended receivers 24, 26 provide two bits of single-ended output (SEO) in the form of outputs $d_3$, $d_4$. The OR gate 28 is used to form an end of packet signal g which is ANDed with outputs $d_1$, $d_2$ via AND gates 30, 32. Without the single-ended receivers 24, 26 the outputs RXP, RXM are uncertain when the inputs DP, DM go to zero to signal the EOP condition. Thus, the single-ended receivers 24, 26 are used only for the EOP condition.

Figure 2:
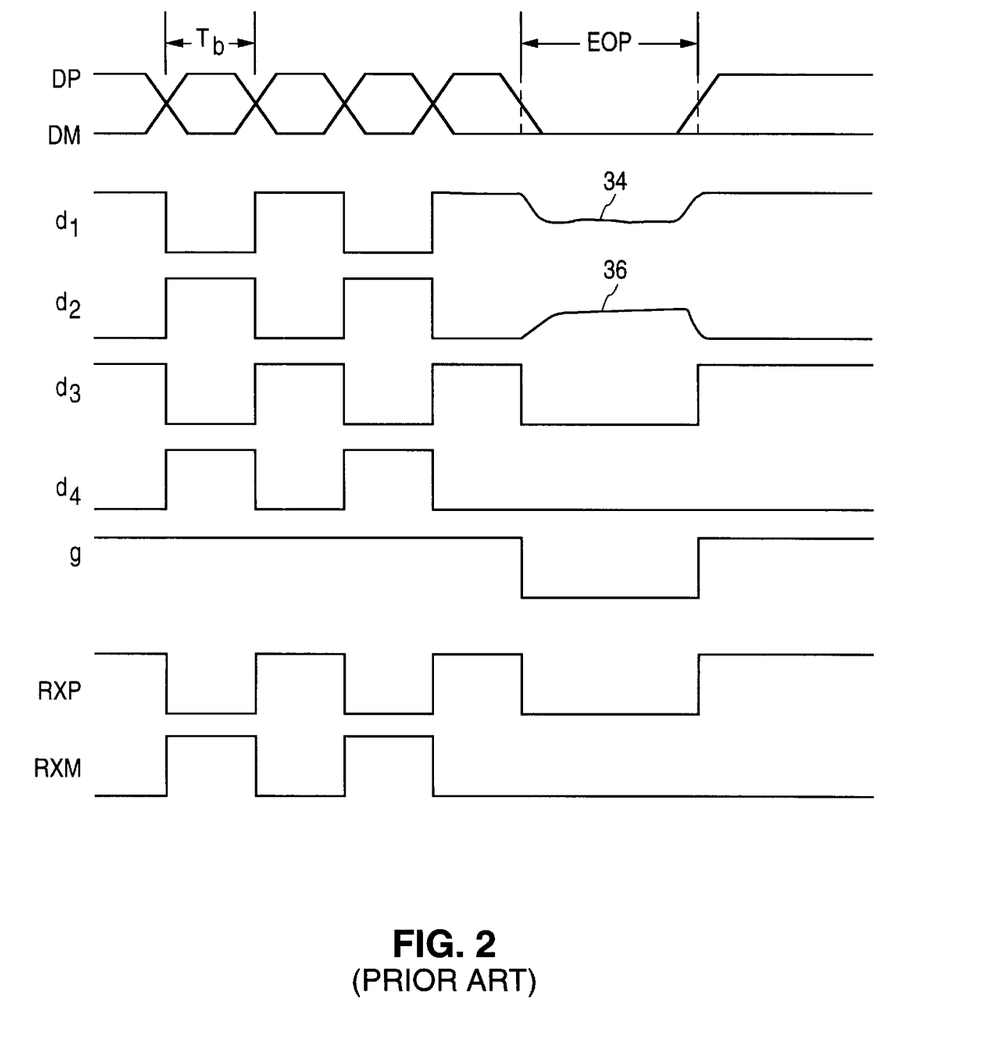
FIG. 2 is a timing diagram illustrating the operation of the USB receiver shown in FIG. 1 when there is no skew between the inputs signals DP, DM.

FIG. 2 illustrates the operation of the USB receiver 20 when there is no skew between the input signals DP and DM. Specifically, when there is no skew between input signals DP and DM, the rise time $T_R$ and fall time $T_F$ of inputs DP and DM are equal, which causes the inputs DP and DM to cross at the mid-point of their transition from high to low, and vise versa. In this scenario, the outputs $d_3$ and $d_4$ are not both low at the same time until input signals DP and DM both go low to signal the EOP condition. Thus, the end of packet signal g is held high until the EOP condition occurs, and as long as signal g is held high, the outputs $d_1$ and $d_2$ of the differential receiver 22 control the outputs RXP and RXM.

When the EOP condition is received, both inputs DP and DM go to zero and remain zero only during the EOP condition. This causes the outputs $d_1$ and $d_2$ to become uncertain, as illustrated by 34, 36, and therefore, the outputs $d_1$ and $d_2$ are unable to control the outputs RXP and RXM. This is where the single-ended receivers 24, 26 control. The single-ended receivers 24, 26 generate zeros at their respective outputs $d_3$, $d_4$ which cause the end of packet signal g to go low via OR gate 28. Because signal g is providing a zero to an input of the each of the AND gates 30, 32, both outputs RXP and RXM go to zero in accordance with the EOP condition.

Figure 3:
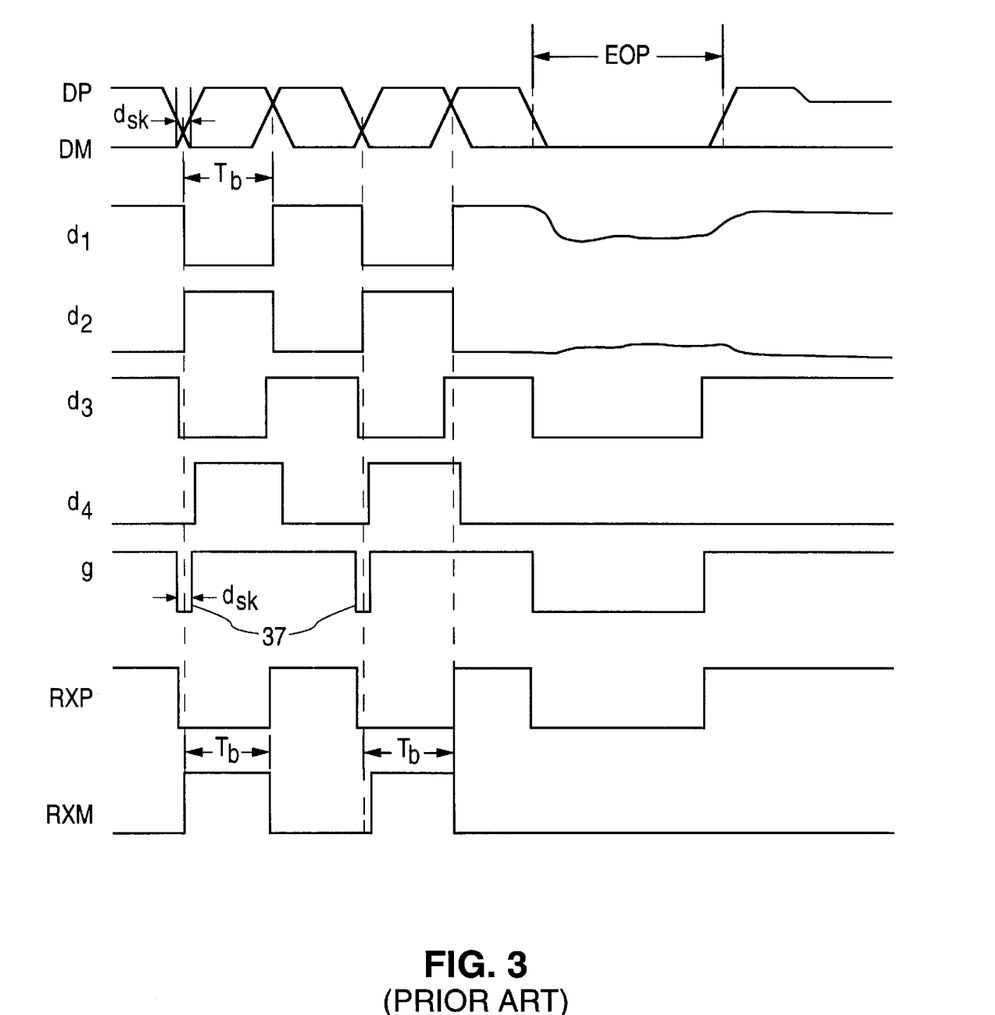
FIG. 3 is a timing diagram illustrating the operation of the USB receiver shown in FIG. 1 when there is skew between the inputs signals DP, DM.

One disadvantage of the USB receiver 20 is illustrated in FIG. 3. Specifically, if there is skew between the input signals DP and DM, or the rise time $T_R$ and fall time $T_F$ of the input signals DP and DM are different, distortion will be caused in the output g which will lead to distortion in outputs RXP and RXM. FIG. 3 shows that the input signal DP is skewed with respect to the input signal DM by an amount $d_{sk}$. This causes the single-ended receivers 24, 26 to each be triggered at different times since they are each triggered at the switching threshold of only one of the signals DP and DM rather than the crossing point of the signals DP and DM. Unwanted glitch pulses 37 with a duration of $d_{sk}$ are produced in the end of packet signal g which distorts the output signals RXP and RXM by $\pm\frac{1}{2}\ d_{sk}$. In other words, signal g goes low before an EOP condition is received, as indicated by the glitches 37, which in turn causes the outputs RXP and RXM to go low even though an EOP condition has not been received.

The data signal quality is degraded by the scheme shown in FIG. 1. Therefore, there is a need for a USB receiver which can compensate for skew and/or differing rise and fall times $T_R$, $T_F$ between the differential inputs DP and DM.

SUMMARY OF THE INVENTION

The present invention provides a circuit for receiving a pair of differential input signals. The circuit includes first and second single-ended receivers which are each configured to receive one of the differential input signals and generate an output. Input glitch prevention circuitry is connected to the first and second single-ended receivers and configured to generate first and second delayed single-ended receiver outputs and to logically OR the outputs of the first and second single-ended receivers and the first and second delayed single-ended receiver outputs to generate an intermediate end of packet signal. Symmetrical delay compensation circuitry is connected to the input glitch prevention circuitry and is configured to generate a final end of packet signal which is delayed from going from low to high for a period of time beyond a point when the intermediate end of packet signal goes from low to high.

The present invention also provides a circuit for receiving a pair of differential input signals. The circuit includes first and second single-ended receivers which are each configured to receive one of the differential input signals and generate an output. First delay circuitry is connected to the first and second single-ended receivers and is configured to generate first and second delayed single-ended receiver outputs. An OR gate is connected to the first and second single-ended receivers and the first delay circuitry and is configured to logically OR the outputs of the first and second single-ended receivers and the first and second delayed single-ended receiver outputs to generate an intermediate end of packet signal. Symmetrical delay compensation circuitry is connected to the OR gate and is configured to generate a final end of packet signal which is delayed from going from low to high for a period of time beyond a point when the intermediate end of packet signal goes from low to high.

The present invention also provides a circuit for receiving a pair of differential input signals. The circuit includes first and second single-ended receivers each configured to receive one of the differential input signals. First and second delay circuits are respectively connected to an output of the first and second single-ended receivers and configured to respectively generate first and second delayed single-ended receiver outputs. An OR gate is connected to the first and second single-ended receivers and the first and second delay circuits and configured to OR together the outputs of the first and second single-ended receivers and the first and second delayed single-ended receiver outputs to form an intermediate end of packet signal. A third delay circuit is connected to the OR gate and configured to generate a delayed intermediate end of packet signal. A first AND gate is connected to the OR gate and the third delay circuit and configured to AND together the intermediate end of packet signal and the delayed intermediate end of packet signal to generate a final end of packet signal.

The present invention also provides a method of receiving differential input signals, comprising the steps of: receiving each differential input signal with a separate single-ended receiver; delaying an output of each of the single-ended receivers to form a delayed single-ended receiver output; ORing together the outputs of the single-ended receivers and the delayed single-ended receiver outputs to form an intermediate end of packet signal; and extending a logic low period of the intermediate end of packet signal to generate a final end of packet signal.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 4:
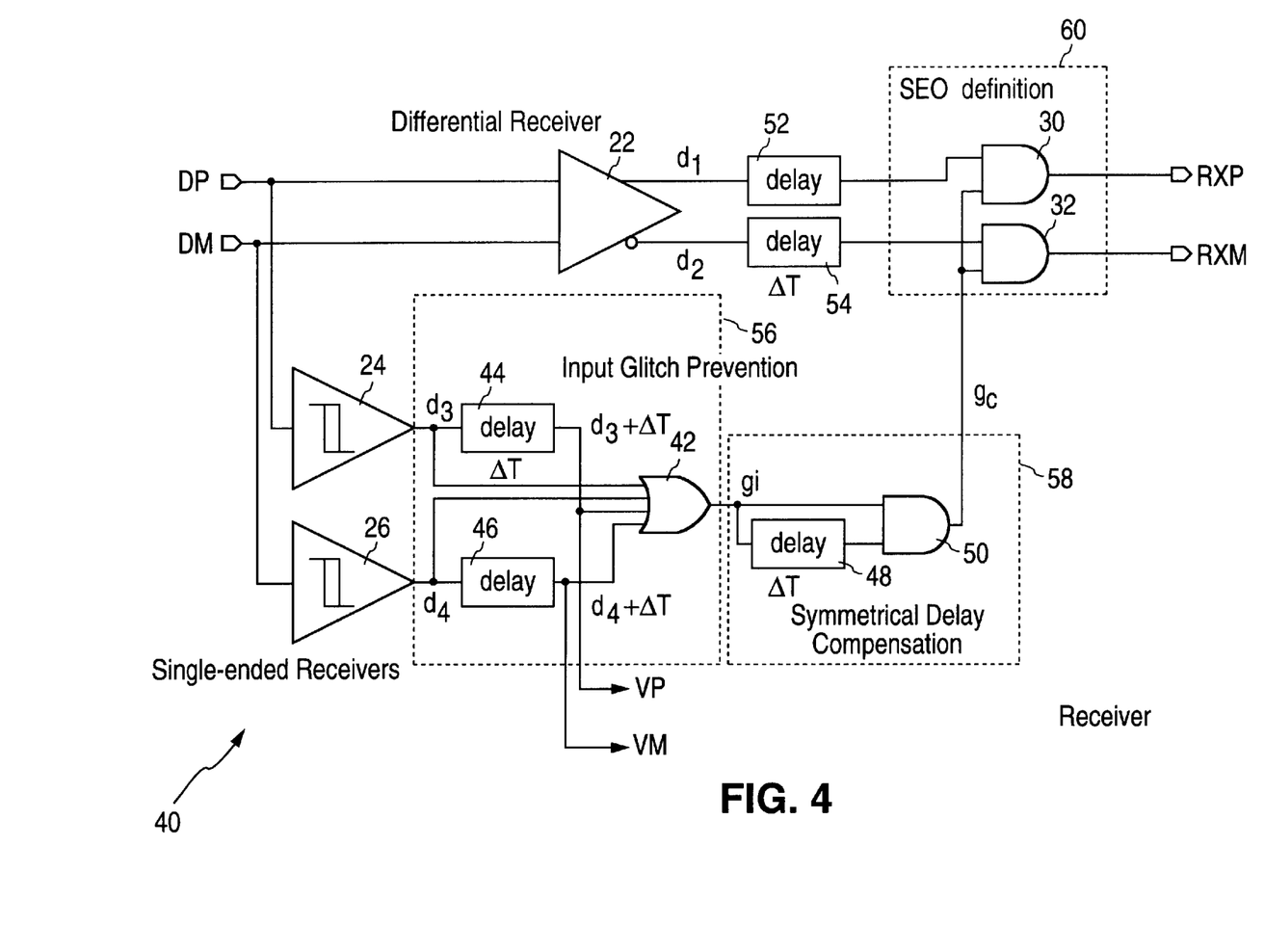
FIG. 4 is a schematic diagram illustrating a USB receiver in accordance with the present invention.

Referring to FIG. 4, there is illustrated a Universal Serial Bus (USB) receiver 40 in accordance with the present invention. The USB receiver 40 meets the USB standard electrical specification and detects an end of packet (EOP) condition without causing distortion of the output data. In general, delay circuits have been inserted in the outputs of the single-ended receivers 24, 26, the output of OR gate 42, and the outputs of the differential receiver 22.

The USB receiver 40 includes input glitch prevention circuitry 56, connected to the single-ended receivers 24, 26, which generates an intermediate end of packet signal $g_i$. The intermediate end of packet signal $g_i$ is received by symmetrical delay compensation circuitry 58 which generates a final end of packet signal $g_c$. The final end of packet signal $g_c$ is ANDed with the outputs of delay circuits 52, 54 in the single-ended output (SEO) definition circuitry 60.

Specifically, the delay circuits 44, 46 are inserted into the outputs $d_3$, $d_4$, respectively, of the single-ended receivers 24, 26. The delay circuits 44, 46 each provide a delay time of $\Delta T$ so that their respective outputs are $d_3+\Delta T$, $d_4+\Delta T$, i.e., delayed single-ended receiver outputs. The output signals $d_3+\Delta T$, $d_4+\Delta T$, together with the original signals $d_3$, $d_4$, are ORed together in OR gate 42 to generate the non-glitch intermediate end of packet signal $g_i$. Because signal $g_i$ is narrowed by $\Delta T$, another delay circuit 48 receives signal $g_i$ to generate the delayed intermediate end of packet signal $g_i+\Delta T$. The two signals $g_i$, $g_i+\Delta T$ are ANDed together by AND gate 50 to generate the final end of packet signal $g_c$. Therefore, the final end of packet signal $g_c$ will include two bits of SEO as specified by the USB standard.

To compensate for the $\Delta T$ delay in the single-ended receiver 24, 26 receiving paths, two identical delay circuits 52, 54 are inserted into the outputs $d_1$, $d_2$, respectively, of the differential receiver 22. The delay circuits 52, 54 generate delayed differential receiver outputs $d_1+\Delta T$, $d_2+\Delta T$. This prevents the outputs RXP, RXM from becoming distorted due to the delay circuits 44, 46 in the single-ended receiver paths 24, 26.

Figure 5:
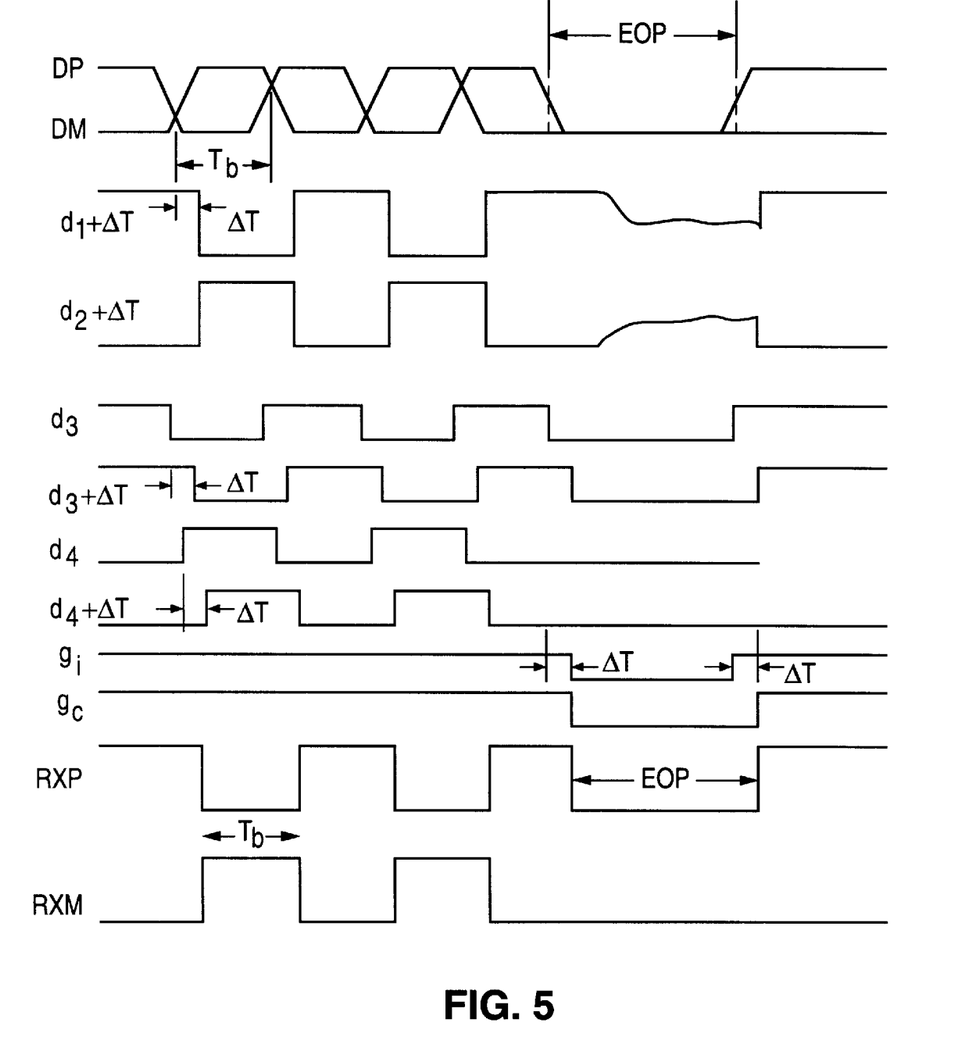
FIG. 5 is a timing diagram illustrating the operation of the USB receiver shown in FIG. 4 when there is skew between the inputs signals DP, DM.

FIG. 5 illustrates the operation of the USB receiver 40. The delay circuits 44, 46 in the outputs $d_3$, $d_4$ of the single-ended receivers 24, 26 prevent signal $g_i$ from going low until inputs DP, DM both go low by ensuring that at least one of the signals $d_3$, $d_4$, $d_3+\Delta T$, or $d_4+\Delta T$ is high while inputs DP, DM are not in the EOP mode. This is because the outputs $d_3+\Delta T$, or $d_4+\Delta T$ are ORed together with the original output signals $d_3$, $d_4$.

The operation of the delay circuit 48 and the AND gate 50 is illustrated by the signal $g_c$ remaining low for an amount of time equal to $\Delta T$ beyond the original signal $g_i$. In other words, the symmetrical delay compensation logic circuitry 58 delays the signal $g_c$ from going from low to high for a period of time $\Delta T$ beyond the point when the signal $g_i$ goes from low to high. This causes signal $g_c$ to remain low for the entire EOP condition which compensates for the delay caused by the delay circuits 44, 46.

Finally, the delay circuits 52, 54 inserted in the outputs $d_1$, $d_2$ compensate for the delay circuits 24, 26 by shifting all of the inputs of the AND gates 30, 32 by an amount equal to $\Delta T$. In other words, all of the data which is produced at outputs RXP, RXM will be shifted by the amount $\Delta T$, i.e, the amount of delay caused by each of the delay circuits 44, 46, 48, 52, 54, to keep the data consistent.

Figure 6:
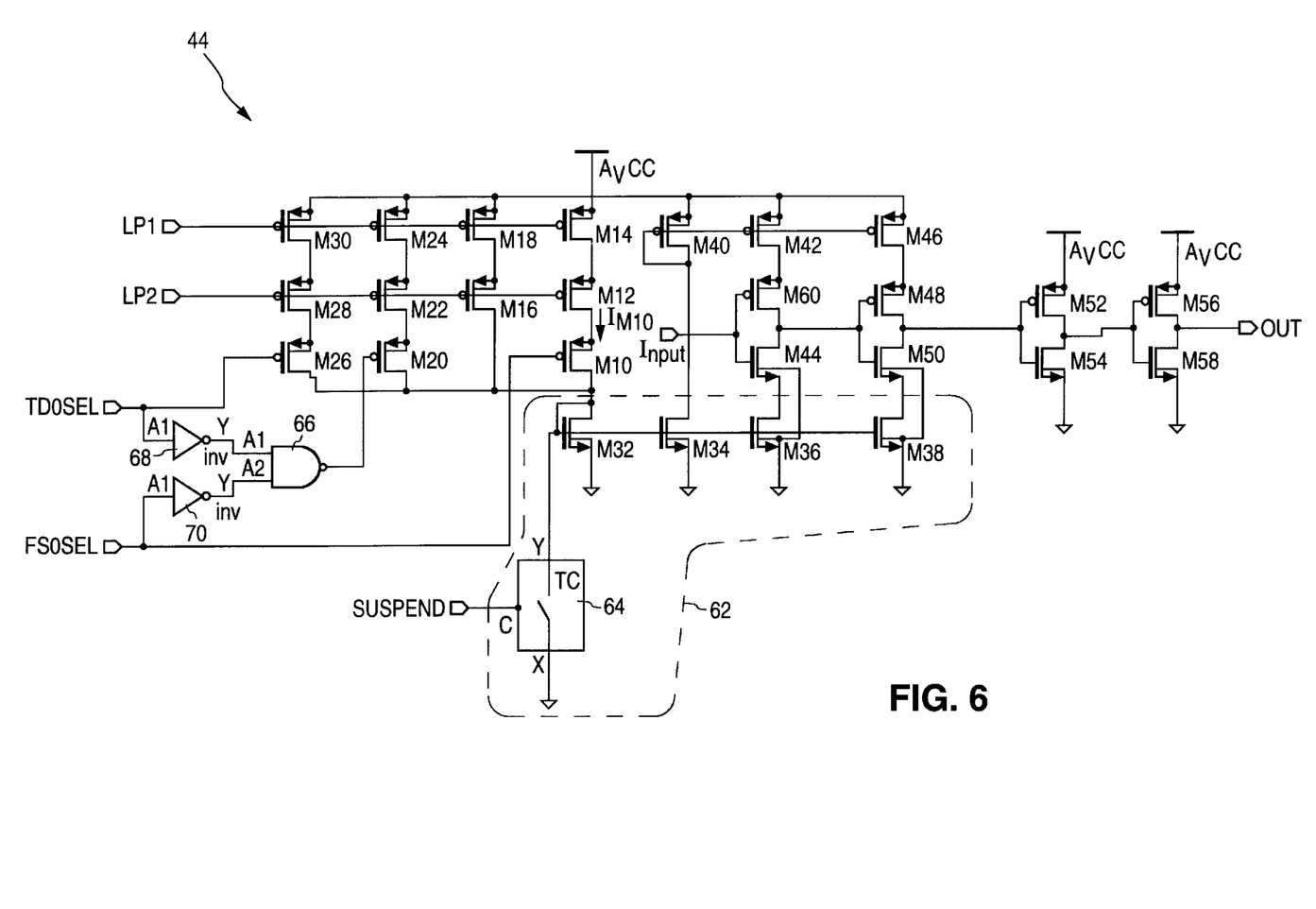
FIG. 6 is a schematic diagram illustrating a delay circuit which may be used in the USB receiver shown in FIG. 4.

Referring to FIG. 6, there is illustrated a detailed schematic diagram of the delay circuit 44. All of the delay circuits 44, 46, 48, 52 and 54 may be of the same design. The delay circuit 44 is programmable with two possible settings. One setting is for full speed operation and the other setting is for low speed operation. The $\Delta T$ for full speed operation is about 10 times the $\Delta T$ for low speed operation.

The input of the delay circuit 44 is labeled "Input" and is connected to the gates of transistors M44, M60. The output is labeled "Out". The delay, i.e., the $\Delta T$, of the delay circuit 44 is changed by increasing or decreasing the speed at which the CMOS transistor pairs M44, M60 and M48, M50 switch on and off. Low speed operation is selected by pulling the FSOSEL input low. This turns transistor M10 on, and the current conducted by transistor M10, i.e., current $I_{M10}$, is added to the current already being conducted by transistor M32. The additional current $I_{M10}$ gets reflected through transistors M34, M36, M38, M40, M42, M46 and causes transistors M44, M60 and transistors M48, M50 to switch on and off faster. Because the speed of transistors M44, M60 and transistors M48, M50 is increased, the delay, i.e., the $\Delta T$, generated by the delay circuit 44 is decreased. This means that the $\Delta T$ is small, which is in accordance with the $\Delta T$ for full speed operation being greater than the $\Delta T$ for low speed operation.

Full speed operation is selected by pulling the FSOSEL input high. This turns transistor M10 off, which results in the current conducted by transistor M32 being lower than in the low speed operation scenario. This causes transistors M44, M60 and transistors M48, M50 to switch on and off more slowly, which increases the delay, i.e., the ΔT, of the delay circuit 44. Again, this is in accordance with the ΔT for full speed operation being greater than the ΔT for low speed operation.

The inputs LP1, LP2 are for receiving a standard current source reference. Circuitry 62 and input SUSPEND are used to put the delay circuit 44 in power save mode.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A circuit for receiving a pair of differential input signals, comprising:
    first and second single-ended receivers each configured to receive one of the differential input signals and generate an output;
    input glitch prevention circuitry connected to the first and second single-ended receivers and configured to generate first and second delayed single-ended receiver outputs and to logically OR the outputs of the first and second single-ended receivers and the first and second delayed single-ended receiver outputs to generate an intermediate end of packet signal; and
    symmetrical delay compensation circuitry connected to the input glitch prevention circuitry and configured to generate a final end of packet signal which is delayed from going from low to high for a period of time beyond a point when the intermediate end of packet signal goes from low to high.

2. A circuit according to claim 1, wherein the input glitch prevention circuitry comprises:
    delay circuitry connected to the first and second single-ended receivers and configured to generate the first and second delayed single-ended receiver outputs;
    an OR gate connected to the first and second single-ended receivers and the delay circuitry and configured to logically OR the outputs of the first and second single-ended receivers and the first and second delayed single-ended receiver outputs to generate the intermediate end of packet signal.

3. A circuit according to claim 1, wherein the symmetrical delay compensation circuitry comprises:
    delay circuitry connected to the input glitch prevention circuitry and configured to generate a delayed intermediate end of packet signal; and
    an AND gate connected to the input glitch prevention circuitry and the delay circuitry and configured to AND together the intermediate end of packet signal and the delayed intermediate end of packet signal to generate the final end of packet signal.

4. A circuit according to claim 1, further comprising:
    a differential receiver configured to receive the pair of differential input signals and having two outputs;
    delay circuitry connected to the differential receiver and configured to generate first and second delayed differential receiver outputs; and
    AND circuitry connected to the symmetrical delay compensation circuitry and the delay circuitry and configured to AND the first delayed differential receiver output with the final end of packet signal and to AND the second delayed differential receiver output with the final end of packet signal.

5. A circuit for receiving a pair of differential input signals, comprising:
    first and second single-ended receivers each configured to receive one of the differential input signals and generate an output;
    first delay circuitry connected to the first and second single-ended receivers and configured to generate first and second delayed single-ended receiver outputs;
    an OR gate connected to the first and second single-ended receivers and the first delay circuitry and configured to logically OR the outputs of the first and second single-ended receivers and the first and second delayed single-ended receiver outputs to generate an intermediate end of packet signal; and
    symmetrical delay compensation circuitry connected to the OR gate and configured to generate a final end of packet signal which is delayed from going from low to high for a period of time beyond a point when the intermediate end of packet signal goes from low to high.

6. A circuit according to claim 5, wherein the symmetrical delay compensation circuitry comprises:
    second delay circuitry connected to the OR gate and configured to generate a delayed intermediate end of packet signal; and
    first AND circuitry connected to the OR gate and the second delay circuitry and configured to AND together the intermediate end of packet signal and the delayed intermediate end of packet signal to generate the final end of packet signal.

7. A circuit according to claim 5, further comprising:
    a differential receiver configured to receive the pair of differential input signals and having two outputs;
    second delay circuitry connected to the differential receiver and configured to generate first and second delayed differential receiver outputs; and
    first AND circuitry connected to the symmetrical delay compensation circuitry and the second delay circuitry and configured to AND the first delayed differential receiver output with the final end of packet signal and to AND the second delayed differential receiver output with the final end of packet signal.

8. A circuit according to claim 5, wherein the first delay circuitry comprises:
    programmable speed control circuitry configured to operate the first delay circuitry in full speed mode and low speed mode.

9. A circuit for receiving a pair of differential input signals, comprising:
    first and second single-ended receivers each configured to receive one of the differential input signals;
    first and second delay circuits respectively connected to an output of the first and second single-ended receivers and configured to respectively generate first and second delayed single-ended receiver outputs;
    an OR gate connected to the first and second single-ended receivers and the first and second delay circuits and configured to OR together the outputs of the first and second single-ended receivers and the first and second delayed single-ended receiver outputs to form an intermediate end of packet signal;

a third delay circuit connected to the OR gate and configured to generate a delayed intermediate end of packet signal; and a first AND gate connected to the OR gate and the third delay circuit and configured to AND together the intermediate end of packet signal and the delayed intermediate end of packet signal to generate a final end of packet signal.

10. A circuit according to claim 9, further comprising:

a differential receiver configured to receive the pair of differential input signals and having two outputs; and fourth and fifth delay circuits respectively connected to each output of the differential receiver and configured to respectively generate first and second delayed differential receiver outputs.

11. A circuit according to claim 10, further comprising:

a second AND gate connected to the fourth delay circuit and the first AND gate and configured to AND together the first delayed differential receiver output and the final end of packet signal; and a third AND gate connected to the fifth delay circuit and the first AND gate and configured to AND together the second delayed differential receiver output and the final end of packet signal.

12. A circuit according to claim 9, wherein the first, second and third delay circuits each comprise:

programmable speed control circuitry configured to operate each respective delay circuit in full speed mode and low speed mode.

13. A receiver, comprising:

first and second input nodes;

a differential receiver having first and second inputs respectively connected to the first and second input nodes, the differential receiver including first and second outputs;

first and second delay circuits respectively connected to the first and second outputs of the differential receiver;

first and second single-ended receivers each having an input respectively connected to the first and second input nodes, the first and second single-ended receivers each having an output;

third and fourth delay circuits respectively connected to the outputs of the first and second single-ended receivers;

an OR gate having separate inputs respectively connected to the outputs of the first and second single-ended receivers and the outputs of the third and fourth delay circuits;

a fifth delay circuit connected to an output of the OR gate;

a first AND gate having separate inputs respectively connected to the output of the OR gate and an output of the fifth delay circuit; and second and third AND gates each having an input connected to an output of the first AND gate and an input respectively connected to the outputs of the first and second delay circuits.

14. A receiver according to claim 13, wherein the first, second, third, fourth and fifth delay circuits each comprise:

programmable speed control circuitry configured to operate each respective delay circuit in full speed mode and low speed mode.

15. A method of receiving differential input signals, comprising the steps of:

receiving each differential input signal with a separate single-ended receiver;

delaying an output of each of the single-ended receivers to form a delayed single-ended receiver output;

ORing together the outputs of the single-ended receivers and the delayed single-ended receiver outputs to form an intermediate end of packet signal; and generating a final end of packet signal which is delayed from going low to high for a period of time beyond a point when the intermediate end of packet signal goes from low to high.

16. A method according to claim 15, wherein the step of generating a final end of packet signal comprises the steps of:

delaying the intermediate end of packet signal to form a delayed intermediate end of packet signal; and ANDing together the intermediate end of packet signal and the delayed intermediate end of packet signal to form the final end of packet signal.

17. A method according to claim 15, further comprising the steps of:

receiving the differential input signals with a differential receiver having two outputs;

delaying each output of the differential receiver to form first and second delayed differential receiver outputs;

ANDing the first delayed differential receiver output with the final end of packet signal; and ANDing the second delayed differential receiver output with the final end of packet signal.

18. A method of receiving differential input signals, comprising the steps of:

receiving each differential input signal with a separate single-ended receiver;

delaying an output of each of the single-ended receivers to form a delayed single-ended receiver output;

ORing together the outputs of the single-ended receivers and the delayed single-ended receiver outputs to form an intermediate end of packet signal;

delaying the intermediate end of packet signal to form a delayed intermediate end of packet signal; and ANDing together the intermediate end of packet signal and the delayed intermediate end of packet signal to form a final end of packet signal.

19. A method according to claim 18, further comprising the steps of:

receiving the differential input signals with a differential receiver having two outputs;

delaying each output of the differential receiver to form first and second delayed differential receiver outputs;

ANDing the first delayed differential receiver output with the final end of packet signal; and ANDing the second delayed differential receiver output with the final end of packet signal.

* * * * *